United States Patent
Sonnhueter et al.

(10) Patent No.: US 9,523,733 B2
(45) Date of Patent: *Dec. 20, 2016

(54) AUTOMATIC TEST EQUIPMENT FOR TESTING AN OSCILLATING CRYSTAL AND METHOD FOR OPERATING THE SAME

(71) Applicant: TEXAS INSTRUMENTS DEUTSCHLAND GmbH, Freising (DE)

(72) Inventors: Ralf Sonnhueter, Schrobenhausen (DE); Anton Ecker, Eching Bayern (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 51 days.

This patent is subject to a terminal disclaimer.

(21) Appl. No.: 14/526,065

(22) Filed: Oct. 28, 2014

(65) Prior Publication Data

US 2015/0042368 A1 Feb. 12, 2015

Related U.S. Application Data

(63) Continuation of application No. 13/289,066, filed on Nov. 4, 2011, now Pat. No. 8,872,523.

(30) Foreign Application Priority Data

Nov. 5, 2010 (DE) .................. 10 2010 050 314

(51) Int. Cl.
*G01R 31/28* (2006.01)
(52) U.S. Cl.
CPC ....... *G01R 31/2824* (2013.01); *G01R 31/2841* (2013.01)
(58) Field of Classification Search
CPC . G01R 31/2841; G01R 31/2824; G01R 27/28; G01R 31/2621; G01R 27/32; G01R 31/016; H01L 24/11; H01L 24/13; H01L 23/562; F28D 19/047; H04N 5/455; H04N 21/4382; A61F 5/451; A61G 9/00; G01B 7/00

(Continued)

(56) References Cited

U.S. PATENT DOCUMENTS 4,301,858 A * 11/1981 Mock .................. F28D 19/047
  165/9
4,485,342 A * 11/1984 Hill ..................... H03K 17/0822
  323/285

(Continued)

FOREIGN PATENT DOCUMENTS

CN 201429673 3/2010

*Primary Examiner* — Arleen M Vazquez
*Assistant Examiner* — Brent J Andrews
(74) *Attorney, Agent, or Firm* — Tuenlap D. Chan; Frank D. Cimino

(57) ABSTRACT

Embodiments of the invention relate to automatic test equipment for testing a circuit having an oscillating crystal and to a method for operating such automatic test equipment. A generator generates a first signal comprising an oscillating part having at least one predetermined frequency. A first terminal couples the first signal to the oscillating crystal. At least one predetermined frequency is located inside a predetermined window around one of the resonance frequencies of the oscillating crystal. An analyzer has a second terminal coupled to the oscillating crystal for detecting a second signal and a rectifier connected in series with a low-pass filter for rectifying and filtering the second signal. A detector for detects a DC-signal at the output of the low-pass filter and for signals a valid test result for the oscillating crystal if the DC-signal exceeds a certain threshold value.

13 Claims, 1 Drawing Sheet

(58) Field of Classification Search
USPC .......................................... 324/750.01, 537
See application file for complete search history.

(56) References Cited

U.S. PATENT DOCUMENTS

| | | | |
|---|---|---|---|
| 2004/0199131 A1* | 10/2004 | Kitamura | A61F 5/451 604/318 |
| 2005/0032485 A1 | 2/2005 | Bachman et al. | |
| 2008/0253485 A1* | 10/2008 | Takashima | H04N 5/455 375/344 |
| 2010/0033254 A1* | 2/2010 | Cao | G01R 31/2824 331/44 |

* cited by examiner

AUTOMATIC TEST EQUIPMENT FOR TESTING AN OSCILLATING CRYSTAL AND METHOD FOR OPERATING THE SAME

CROSS-REFERENCE TO RELATED APPLICATIONS

This application is a continuation of application Ser. No. 13/289,066, filed Nov. 4, 2011 (now U.S. Pat. No. 8,872,523), which claims priority from German Patent Application No. 10 2010 050 314.2, filed Nov. 5, 2010, the entirety of which are hereby incorporated by reference for all purposes.

FIELD OF THE INVENTION

The invention relates to automatic test equipment for testing a circuit having an oscillating crystal and to a method for operating such automatic test equipment.

BACKGROUND

Automatic test equipment (ATE) is an apparatus performing a more or less automated test or a plurality of tests on a device. Preferably, ATE use automation to quickly perform measurements and evaluation of the test results. The name ATE is widely used and ranges from a computer controlled digital multimeter to a complicated system comprising a plurality of test instruments. Highly sophisticated ATE is capable of automatically testing and diagnosing faults in electronic mass production environment, including test of packaged parts, wafer testing, test of systems on chips and other integrated circuits. ATE is widely used in the electronic manufacturing industry to test electronic components and systems preferably after being fabricated. Electronic devices that may be a subject to an automated test by an ATE system are ranging from single components such as resistors, capacitors or inductors up to highly integrated circuits. Typically, ATE is designed to minimize the amount of test time needed to verify whether a particular circuit or device works properly or to quickly detect faults. Tests are preferably performed with respect to the question of whether the circuit under inspection has a chance to be used as a final consumer product.

SUMMARY

It is an object of the invention to provide automatic test equipment and a method for operating the same allowing a quick and reliable test of a circuit comprising an oscillating crystal.

In an aspect of the invention, automatic test equipment for testing a circuit having an oscillating crystal is provided. The automatic test equipment comprises a generator for generating a first signal comprising an oscillating part having at least one predetermined frequency. The automatic test equipment further comprises a first terminal for coupling the first signal to the oscillating crystal. The at least one predetermined frequency is located inside a predetermined window around one of the resonance frequencies of the oscillating crystal. The automatic test equipment further comprises an analyzer having a second terminal that is coupled to the oscillating crystal for detecting a second signal. A rectifier that is coupled in series with a low pass filter for rectifying and filtering the second signal is also a part of the analyzer. Said analyzer further comprises a detector for detecting a DC signal at the output of the low pass filter and for signaling a valid test result for the oscillating crystal if the DC signal exceeds a certain threshold value.

The automatic test equipment allows a simple, effective and reliable verification whether the oscillating crystal is mounted properly on the circuit and whether it is working appropriately. Further advantageously, the automatic test equipment allows a simple and reliable verification whether a certain type of oscillating crystal is mounted on the circuit.

In general, an oscillating crystal may be characterized by its resonance frequencies. An oscillating crystal behaves like a serial oscillating circuit, which means that its impedance curve has local minima at or near by its resonance frequencies. Typically, an oscillating crystal has a plurality of resonance frequencies due to its different mechanical oscillation modi (e.g. longitudinal mode, thickness shear mode, etc.). Accordingly, the impedance curve also shows a plurality of local minima.

When coupling an input signal to the oscillating crystal having a frequency that is equal to or nearby one of said resonance frequencies, a signal may be detected at the output of the oscillating crystal. Damping is very low due to the minimal impedance. The detected signal is subject to a following rectification and is further low pass filtered. This leads to a DC signal indicating that the oscillating crystal is mounted appropriately. Further, the frequency of the first signal may be chosen to match with just one of the resonance frequencies of a certain type of crystal. The DC signal in combination with this information gives a test result indicating whether the desired type of oscillating crystal is mounted on the circuit. The DC signal has to exceed a certain threshold value. The strength of the DC signal on one hand indicates that the first signal is matching sufficiently with one of the resonance frequencies of the oscillating crystal. On the other hand, the strength of the DC signal indicates whether the oscillating crystal is working properly.

The low pass filter of the ATE is a capacitor and the rectifier is a half wave rectifier comprising a diode working as such. Since the quality of the DC signal is not goal, a simple rectifier is sufficient. Also a full wave rectifier or even more sophisticated low pass filtering devices may be applied. However, the aforementioned embodiment allows a very simple and cost saving realization of the ATE.

It is further advantageous, if the analyzer of the automatic test equipment is configured to define a window having a width that is the full width at half maximum of a resonance curve at a resonance frequency of the oscillating crystal. The frequency of the first signal is located inside the window. Further advantageously, the predetermined frequency equals one of the resonance frequencies of the oscillating crystal.

Let's assume, the excitation frequency, e.g. the frequency of the first signal, is tuned. At the same time, the impedance of the respective oscillating crystal is observed. The resulting curve does not show sharp single drops of the impedance result, but however a smooth curve having several local minima around the respective resonance frequencies of the crystal. At a local minimum, the curve will also have a certain width, which means that in a region around the resonance frequencies, the impedance has already fallen significantly. Consequently, no exact matching between the excitation frequency of the first signal and the resonance frequencies is necessary. If the excitation frequency is located in a certain region around the resonance frequency, a satisfying DC signal will be detected.

The aforementioned certain region around the resonance frequency preferably is a window having a width that is defined by the full width at half maximum value of the local minimum. Inside this window, a significant drop of the impedance value has already taken place. This leads to reliable results for the DC signal. On the other hand, exciting the crystal with a frequency that is located inside that window is less complicated in comparison to an excitation using an exact value, i.e. the exact resonance frequency. The highest DC signal however is achieved if the excitation frequency matches more or less exactly with one of the respective resonance frequencies of the oscillating crystal.

Further, the first signal comprises a plurality of predetermined frequencies corresponding to the resonance frequencies of the oscillating crystal. However, not all of the resonance frequencies of the oscillating crystal have to be included in the first signal. It may be an option to include just the strongest resonance frequencies of the oscillating crystal, i.e. the respective excitation frequencies in the first signal. The different resonance frequencies give a characteristic fingerprint for each kind of crystal. Exciting the crystal at different resonance frequencies and watching the resulting DC signal, not only allows to figure out whether the oscillating crystal is present on the circuit and is working properly but also allows to identify exactly which type of crystal is mounted on the circuit.

The automatic test equipment is configured to couple the oscillating crystal to the ATE by using switches having a low capacitive load. This allows a minimization of capacitive losses within the respective switches.

Further, a method for operating automatic test equipment for testing an oscillating crystal is provided. The automatic test equipment comprises a generator, a first and a second terminal, a detector and an analyzer. The method comprising the steps of: coupling the first and second signal to different terminals of the oscillating crystal; coupling a first signal that is generated by a generator via the first terminal to the oscillating crystal and detecting a second signal at the second terminal with the analyzer. The first signal comprises an oscillating part having at least one predetermined frequency that is located inside a predetermined window around one of the resonance frequencies of the oscillating crystal. The method further comprises the step of rectifying and low pass filtering the second signal. This step is also performed by the analyzer. A DC signal is further detected inside the rectified and low pass filtered signal. If the DC signal exceeds a certain threshold value, the detector gives a valid test result for the oscillating crystal to the output.

Same or similar advantages already mentioned for the ATE apply to the method of operating the same.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF EMBODIMENTS

Figure 1:
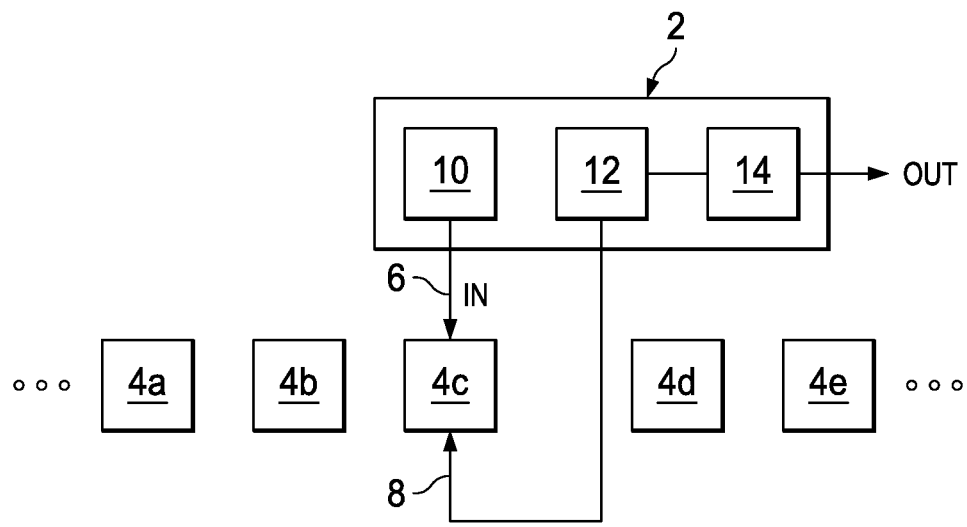
FIG. 1 is a schematic diagram of automatic test equipment for testing a circuit having an oscillating crystal, according to an embodiment of the invention.

Refer now to the drawings wherein depicted elements are, for the sake of clarity, not necessarily shown to scale and wherein like or similar elements are designated by the same reference numeral through the several views.

FIG. 1 shows a schematic diagram of automatic test equipment 2 (ATE) for testing circuits 4a-4e having an oscillating crystal. The circuits 4a-4e may be a single oscillating crystal preferably having a suitable housing and terminals, a discrete analog or digital circuit or a highly integrated circuit having an oscillating crystal. Exemplarily, it may be assumed that a plurality of circuits 4a-4e have to pass through a test stage comprising an ATE 2 within a production line.

The ATE 2 comprises a first terminal 6 and a second terminal 8, e.g. suitable contacts that may be coupled to the respective circuit for performing a test of the oscillating crystal. The ATE 2 further comprises a generator 10 for generating a first signal that is coupled via the first terminal 6 to the circuit 4c that is presently under inspection. This first signal comprises an oscillating part or fraction having at least one predetermined frequency. For example, the first signal may be a mixture of different sinusoidal signals having different frequencies.

By way of an example only, circuit 4c that is presently under inspection may have an oscillating crystal having a resonance frequency F1. The resonance frequency F1 is known since it is known which type of oscillating crystal is mounted on the circuit. Resonance frequencies of oscillating crystals are typical hardware parameters that are known from the data sheet of the manufacturer. A spread of the production however defines a certain range for the expected values.

If the oscillating crystal is excited with the resonance frequency F1, its impedance will be significantly lower compared to an excitation with a frequency that is different from F1. The impedance curve, as a function of the excitation frequency, shows a significant drop, i.e. a local minimum at the resonance frequency F1. This minimum has a certain width DF1. Preferably, the width DF1 is defined by the full width at half maximum value of the resonance curve. The first signal, i.e. its oscillating part, has a predetermined frequency F2 that is preferably located within the window around the resonance frequency F1, that is defined by DF1.

When exciting the oscillating crystal with a first signal comprising an oscillating part having a frequency F2, a signal may be detected at the second terminal 8. The magnitude of the signal depends on the impedance value of the oscillating crystal at F2. The second signal will increase when the excitation frequency F2 approaches the resonance frequency F1 of the oscillating crystal and reach its maximum if F1 is equal to F2. Consequently, the highest magnitude of the second signal is achieved when the two aforementioned frequencies are matching exactly. However, it is not always possible to achieve this goal. This is due to the variation in the resonance frequency F1 from one oscillating crystal to another due to a manufacturing spread.

The second signal is detected at the second terminal 8 by a suitable analyzer 12 that is also a part of the ATE 2. A detector 14 gives a valid test result to the output OUT, if the second signal exceeds a certain threshold value. For easier analysis, not the oscillating second signal but a DC signal is used as an output. Accordingly, the detector 14 rectifies and low-pass filters the second signal.

The aforementioned method for testing a circuit having an oscillating crystal may also be performed using a plurality of excitation frequencies corresponding to different resonance frequencies of the oscillating crystal. This option may lead to a more sophisticated ATE and method for testing, respectively. The different resonance frequencies are like a fingerprint for a certain type of crystal. Depending on whether all or just a part or in worst case none of the resonance frequencies is matching with an excitation frequency, the magnitude of the second signal will alter between its highest, a middle and its lowest value. With such a method for testing it is not only possible to check whether an oscillating crystal is mounted on the circuit, but also it is possible to find out which type of crystal, i.e. the desired crystal, is present.

According to a further option, a fixed number, i.e. fixed excitation frequencies may be included in the first signal. As a result, different types of oscillating crystals may be checked and identified depending on whether they have one, two or more resonance frequencies that are matching with the respective excitation frequencies. It should be noticed that no change in the test equipment is necessary.

By way of an example only, the first signal may include three excitation frequencies F1, F1', F1". A plurality of different circuits having different oscillating crystals, e.g. a first type, having solely a resonance frequency F2, a second type having a resonance frequency F2' and for a third type of crystal having two resonance frequencies F2 and F2" will be tested. It is assumed that F1 is located within a window around F2, F1' is located in a window around F2' and F1" is located in a window around F2". For the first type of crystal, a first level of the second signal, i.e. the DC-signal is detected. The level depends on the strength of the resonance at F1. Since the second resonance at F2', e.g. due to another type of mechanical oscillation of the crystal may be smaller than the first type of resonance at F2, the resulting second signal has a lower level. In case the third type of crystal is included in the circuit that is presently under examination, the highest level of the second signal is achieved since the presence of two resonance frequencies leads to a very low value of impedance.

Figure 2:
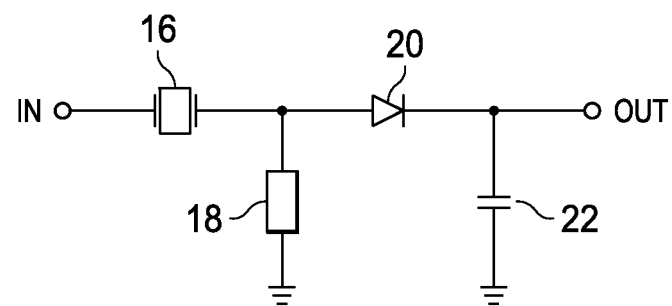
FIG. 2 is a simplified circuit diagram showing details of automatic test equipment, mainly its analyzer, according to an embodiment of the invention.

FIG. 2 shows a simplified circuit diagram comprising an oscillating crystal 16, a resistor 18, a diode 20 and a capacitor 22. The first signal is coupled into the IN-terminal of the oscillating crystal 16. The second signal is detected at the second and opposite terminal of the oscillating crystal 16. It is rectified by the diode 20 acting as a half-wave rectifier. The capacitor 22 that is connected to ground acts as low pass filter. Accordingly, a DC voltage is output to the output terminal OUT.

By simply watching the voltage at the terminal OUT during the test that is performed by the ATE 2, which is normally a mass production test that is performed within a short test-time and with a very high number of tested circuits 4a-4e, a quick and reliable signal may be detected, i.e. the DC signal, indicating whether the desired oscillating crystal is mounted on the respective circuit. The method for testing simply comprises: coupling the first and second terminals 6, 8 to the different terminals of the oscillating crystal 16, applying the first signal via the first terminal 6 to the oscillating crystal 16 and detecting a second signal at the second terminal 8 at the opposite terminal of the oscillating crystal 16. The second signal is further rectified by the diode 20 and low-pass filtered by the capacitor 22. At the output terminal OUT a DC signal is detected that gives a valid test result for the oscillating crystal.

Having thus described the invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the invention may be employed without a corresponding use of the other features. Accordingly, it is appropriate that the appended claims be construed broadly and in a manner consistent with the scope of the invention.

What is claimed is:

1. Automatic test equipment for testing a circuit having an oscillating crystal, the automatic test equipment comprising:
   a generator for generating a first signal comprising an oscillating part having a plurality of predetermined frequencies and a plurality of resonance frequencies;
   a first terminal for coupling the first signal to the oscillating crystal, wherein the plurality of predetermined frequencies are located inside a predetermined window around one of the plurality of resonance frequencies of the oscillating crystal;
   an analyzer, comprising:
      a second terminal that is coupled to the oscillating crystal for detecting a second signal; and
      a rectifier that is coupled in series with a low-pass filter for rectifying and filtering the second signal; land
   a detector for detecting a DC-signal at the output of the low-pass filter and for signaling a valid test result for the oscillating crystal if the DC-signal exceeds a certain threshold value.

2. Automatic test equipment according to claim 1, wherein the low-pass filter is a half-wave rectifier comprising a diode working as a rectifier and a wherein the filter comprises a capacitor working as a low-pass filter.

3. Automatic test equipment according to claim 1, wherein the width of the window is a full width at half maximum of a resonance curve of the oscillating crystal at one of the resonance frequencies.

4. Automatic test equipment according to claim 1, wherein the predetermined frequency equals one of the resonance frequencies of the oscillating crystal.

5. Automatic test equipment according to claim 1, wherein the first signal comprises a plurality of predetermined frequencies corresponding to resonance frequencies of the oscillating crystal.

6. Automatic test equipment according to claim 1, wherein the oscillating crystal is coupled to the automatic test equipment using switches having a low capacitive load.

7. A method of operating an automatic test equipment for testing a circuit having an oscillating crystal with a plurality of resonance frequencies, the automatic test equipment comprising: a generator, a first, and a second terminal, a detector, and an analyzer, the method comprising:
   coupling the first and second terminal to different terminals of the oscillating crystal;
   coupling a first signal that is generated by the generator via the first terminal to the oscillating crystal, wherein the first signal comprises an oscillating part having a plurality of predetermined frequencies that are located inside a predetermined window around one of the resonance frequencies of the oscillating crystal, wherein a width of the window is a full width at half maximum of a resonance curve of the oscillating crystal at one of the resonance frequencies;

detecting a second signal at the second terminal;

rectifying and low-pass filtering the second signal with the analyzer; and detecting a DC-signal with the detector in the rectified and low-pass filtered signal and signaling a valid test result for the oscillating crystal if the DC-signal exceeds a certain threshold value.

8. The method according to claim 7, wherein filtering the second signal uses a half-wave rectifier comprising a diode working as a rectifier.

9. The method according to claim 8, further comprising using a capacitor as a low-pass filter.

10. The method according to claim 7, wherein the width of the window is a full width at half maximum of a resonance curve of the oscillating crystal at one of the resonance frequencies.

11. The method according to claim 7, wherein the predetermined frequency equals one of the resonance frequencies of the oscillating crystal.

12. The method according to claim 7, wherein the first signal comprises a plurality of predetermined frequencies corresponding to resonance frequencies of the oscillating crystal.

13. The method according to claim 7, wherein the oscillating crystal is coupled to the automatic test equipment using switches having a low capacitive load.

\* \* \* \* \*